United States Patent
Sawachi et al.

(10) Patent No.: US 11,538,665 B2
(45) Date of Patent: Dec. 27, 2022

(54) GAS SUPPLY SYSTEM, SUBSTRATE PROCESSING APPARATUS, AND CONTROL METHOD FOR GAS SUPPLY SYSTEM

(71) Applicant: TOKYO ELECTRON LIMITED, Tokyo (JP)

(72) Inventors: Atsushi Sawachi, Miyagi (JP); Norihiko Amikura, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 107 days.

(21) Appl. No.: 17/079,947

(22) Filed: Oct. 26, 2020

(65) Prior Publication Data

US 2021/0134564 A1 May 6, 2021

(30) Foreign Application Priority Data

Nov. 1, 2019 (JP) .............................. JP2019-199623

(51) Int. Cl.
*H01J 37/32* (2006.01)

(52) U.S. Cl.
CPC .... *H01J 37/32449* (2013.01); *H01J 37/3244* (2013.01); *H01J 2237/186* (2013.01)

(58) Field of Classification Search
CPC ............. H01J 37/32449; H01J 37/3244; H01J 2237/186
See application file for complete search history.

(56) References Cited

U.S. PATENT DOCUMENTS

| 2005/0064609 A1* | 3/2005 | Nagaoka | H01L 21/67253 118/712 |
| 2007/0048869 A1* | 3/2007 | Lee | C23C 16/45561 118/314 |
| 2019/0085450 A1* | 3/2019 | Takeuchi | C23C 16/45544 |

FOREIGN PATENT DOCUMENTS

JP          H02-50421 A       2/1990

* cited by examiner

*Primary Examiner* — Yuechuan Yu
(74) *Attorney, Agent, or Firm* — Weihrouch IP

(57) ABSTRACT

A gas supply system includes first and second gas supply lines, first and second valves, and a controller. The first gas supply line is connected between a process gas source and a substrate processing chamber and has an intermediate node. The second gas supply line is connected between a purge gas source and the intermediate node. The first valve is disposed upstream of the intermediate node on the first gas supply line. The second valve is disposed upstream of the first valve on the first gas supply line. A controller controls the first and second valves to open the first and second valves in a first mode for supplying a process gas from the process gas source to the substrate processing chamber, and close the first and second valves in a second mode for supplying a purge gas from the purge gas source to the substrate processing chamber.

6 Claims, 4 Drawing Sheets

GAS SUPPLY SYSTEM, SUBSTRATE PROCESSING APPARATUS, AND CONTROL METHOD FOR GAS SUPPLY SYSTEM

CROSS-REFERENCE TO RELATED APPLICATIONS

This application claims priority to Japanese Patent Application No. 2019-199623, filed on Nov. 1, 2019, the entire contents of which are incorporated herein by reference.

TECHNICAL FIELD

The present disclosure relates to a gas supply system, a substrate processing apparatus, and a control method for the gas supply system.

BACKGROUND

Japanese Patent Application Publication No. H02-50421 discloses that a purge gas inlet line is connected to a line through which a processing gas used for substrate processing flows, and a valve disposed upstream of the line is switched from an open state to a closed state when the processing gas is switched to a purge gas.

The present disclosure provides a technique capable of suppressing backflow of a purge gas to an upstream side of a line.

SUMMARY

In accordance with an aspect of the present disclosure, there is provided a gas supply system including: a first gas supply line connected between a process gas source and a substrate processing chamber, the first gas supply line having an intermediate node; a second gas supply line connected between a purge gas source and the intermediate node; a first valve disposed upstream of the intermediate node on the first gas supply line; a second valve disposed upstream of the first valve on the first gas supply line; and a controller to control the first valve and the second valve to open the first and second valves in a first mode for supplying a process gas from the process gas source to the substrate processing chamber, and close the first and second valves in a second mode for supplying a purge gas from the purge gas source to the substrate processing chamber.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
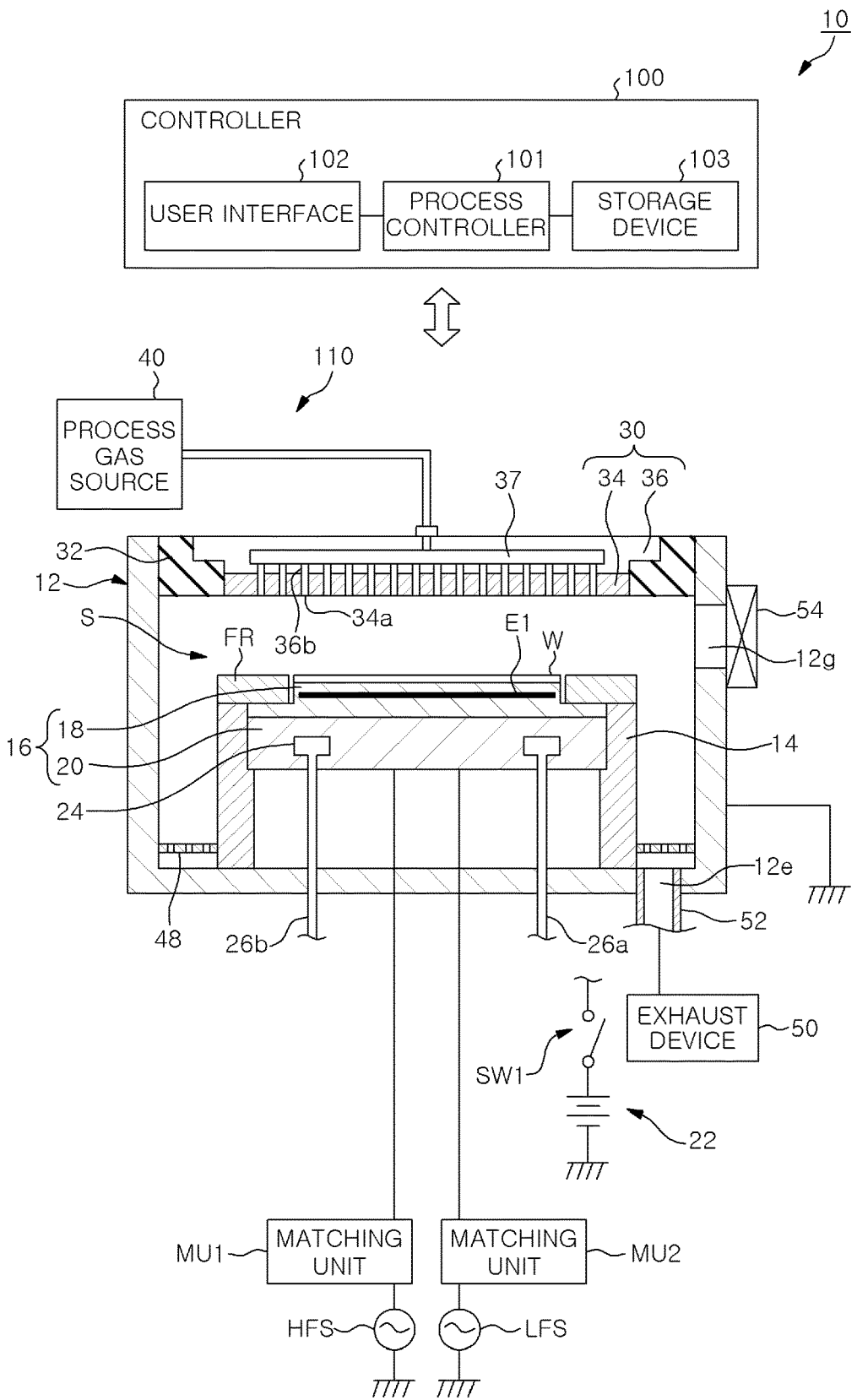
FIG. 1 is a schematic cross-sectional view of an example of a plasma processing apparatus according to an embodiment.

Hereinafter, embodiments will be described in detail with reference to the accompanying drawings. Like reference numerals will be given to like or corresponding parts throughout the drawings.

In a substrate processing apparatus, when a gas flowing through a line is switched from a processing gas to a purge gas, leakage may occur in a valve disposed upstream of the line. When the purge gas begins to be supplied from a purge gas supply line to the line in a state where the leakage occurs in the valve disposed upstream of the line, the purge gas passes through the valve and flows backward to the upstream side of the line. The backflow of the purge gas to the upstream side of the line is not preferable because it causes mixing of the purge gas with the processing gas. Therefore, the backflow of the purge gas to the upstream side of the line is to be suppressed.

(Configuration of the Substrate Processing Apparatus)

A configuration of a substrate processing apparatus according to an embodiment will be described. The substrate processing apparatus is configured to perform predetermined substrate processing on a substrate such as a wafer or the like. In the present embodiment, a case where the substrate processing apparatus is a plasma processing apparatus 10 that is configured to perform processing such as plasma etching on the wafer W serving as a substrate will be described as an example. FIG. 1 is a schematic cross-sectional view of an example of a plasma processing apparatus according to an embodiment. The plasma processing apparatus 10 shown in FIG. 1 is a capacitively coupled parallel plate plasma etching apparatus. The plasma processing apparatus 10 includes a substantially cylindrical substrate processing chamber 12.

A substrate support 16 is disposed in the substrate processing chamber 12. The substrate support 16 includes a supporting member 18 and a base 20. The supporting member has an upper surface that is a substrate supporting surface on which a plasma processing target is placed. In the present embodiment, a wafer W that is the plasma etching target is placed on the upper surface of the supporting member 18. The base 20 has a substantially disc shape, and its main portion is made of a conductive metal such as aluminum. The base 20 forms a lower electrode. The base 20 is supported by a support portion 14. The support portion 14 is a cylindrical member extending upward from the bottom of the substrate processing chamber 12.

A first radio frequency (RF) power supply HFS is electrically coupled to the base 20 through a matching unit MU1. The first RF power supply HFS is configured to generate a RF power for plasma generation having a frequency within a range of 27 MHz to 100 MHz, e.g., 40 MHz. The matching unit MU1 has a circuit configured to match an output impedance of the first RF power supply HFS and an input impedance of a load side (the base 20 side).

A second RF power supply LFS is electrically coupled to the base 20 through a matching unit MU2. The second RF power supply LFS is configured to generate a RF power (RF bias power) for attracting ions to the wafer W and supply the RF bias power to the base 20. The RF bias power has a frequency within a range of 400 kHz to 13.56 MHz, e.g., 3 MHz. The matching unit MU2 has a circuit configured to match an output impedance of the second RF power supply LFS and the input impedance of the load side (the base 20 side).

The supporting member 18 is disposed on the base 20. The supporting member 18 is, for example, an electrostatic chuck. The supporting member 18 is configured to attract and hold the wafer W by electrostatic force such as a Coulomb force. The supporting member 18 has an electrode E1 for electrostatic attraction in a main body thereof that is formed of ceramic. A direct-current (DC) power supply 22 is electrically connected to the electrode E1 through a switch SW1. The supporting member 18 may include a heater for controlling a temperature of the wafer W.

A focus ring FR is disposed around the supporting member 18 disposed on an upper surface of the base 20. The focus ring FR is provided to improve the uniformity of plasma processing. The focus ring FR is formed of a material that is appropriately selected depending on the plasma processing to be performed. Thus, the focus ring FR may be formed of silicon or quartz, for example.

A coolant flow channel 24 is formed in the base 20. A coolant is supplied to the coolant flow channel 24 from a chiller unit through a line 26*a*. The coolant flow channel 24 is disposed external to the substrate processing chamber 12. The coolant supplied to the coolant flow channel 24 returns to the chiller unit through a line 26*b*.

The substrate processing chamber 12 further includes therein an upper electrode 30 also serving as a shower head for injecting a gas toward the wafer W. The upper electrode 30 is disposed above the substrate support 16 to be opposed to the base 20, and the base 20 and the upper electrode 30 are disposed substantially in parallel to each other. A processing space S is formed between the upper electrode 30 and the base (lower electrode) 20. In the processing space S, plasma for performing plasma processing on the wafer W is generated.

The upper electrode 30 is supported at an upper portion of the substrate processing chamber 12 through an insulating shield member 32. The upper electrode 30 may include an electrode plate 34 and an electrode holder 36. The electrode plate 34 faces the processing space S. The electrode plate 34 has a plurality of gas injection holes 34*a*.

The electrode holder 36 is formed of a conductive material such as aluminum and detachably holds the electrode plate 34. The electrode holder 36 may have a water-cooling structure. A disc-shaped gas diffusion space 37 is formed in the electrode holder 36. A plurality of gas holes 36*b* respectively communicating with the gas injection holes 34*a* extend downward from the gas diffusion space 37.

The plasma processing apparatus 10 includes a process gas source 40 for supplying various gases used for plasma processing. Further, a gas supply system 110 for supplying the gas supplied from the process gas source 40 to the gas diffusion space 37 is connected to the electrode holder 36. The gas supply system 110 will be described in detail later.

The gas supplied to the gas diffusion space 37 is injected to the processing space S through the gas holes 36*b* and the gas injection holes 34*a*. The plasma processing apparatus 10 controls the process gas source 40 and the gas supply system 110 to control a flow rate of each of the processing gases injected from the gas injection holes 34*a* of the gas diffusion space 37 into the processing space S.

At a bottom portion of the substrate processing chamber 12, a gas exhaust plate 48 is disposed between the support portion 14 and an inner wall of the substrate processing chamber 12. The gas exhaust plate 48 is formed by coating ceramic such as $Y_2O_3$ on an aluminum base, for example. The substrate processing chamber 12 includes a gas outlet 12*e* disposed below the gas exhaust plate 48. An exhaust device 50 is connected to the gas outlet 12*e* through a gas exhaust line 52. The exhaust device 50 has a vacuum pump such as a turbo molecular pump and is configured to reduce a pressure in the substrate processing chamber 12 to a desired vacuum level. Further, a loading/unloading port 12*g* for a wafer W is disposed on a sidewall of the substrate processing chamber 12. The loading/unloading port 12*g* can be opened and closed by a gate valve 54.

The operation of the plasma processing apparatus 10 configured as described above is integrally controlled by a controller 100. The controller 100 is, e.g., a computer, and controls the individual components of the plasma processing apparatus 10.

The controller 100 includes a process controller 101 having a CPU and configured to control the individual components of the plasma processing apparatus 10, a user interface 102, and a storage device 103.

The user interface 102 includes a keyboard through which a process manager inputs commands to manage the plasma processing apparatus 10, and a display for visualizing and displaying an operation status of the plasma processing apparatus 10.

The storage device 103 is configured to store a control program (software) for realizing various processes performed by the plasma processing apparatus 10 under the control of the process controller 101 or a recipe in which process condition data or the like is stored. When the process controller 101 retrieves and executes any recipe from the storage device 103 in response to an instruction from the user interface 102 or the like, desired processing is performed in the plasma processing apparatus 10 under the control of the process controller 101. For example, the process controller 101 controls the individual components of the plasma processing apparatus 10 to execute a control method of the gas supply system 110 to be described later. The control program or the recipe such as the processing condition data may be stored in a computer-readable storage medium (e.g., a hard disk, a CD, a flexible disk, a semiconductor memory, or the like). Further, the control program or the recipe such as the processing condition data may be transmitted, when needed, from other apparatuses through, e.g., a dedicated line, and used online.

Figure 2:
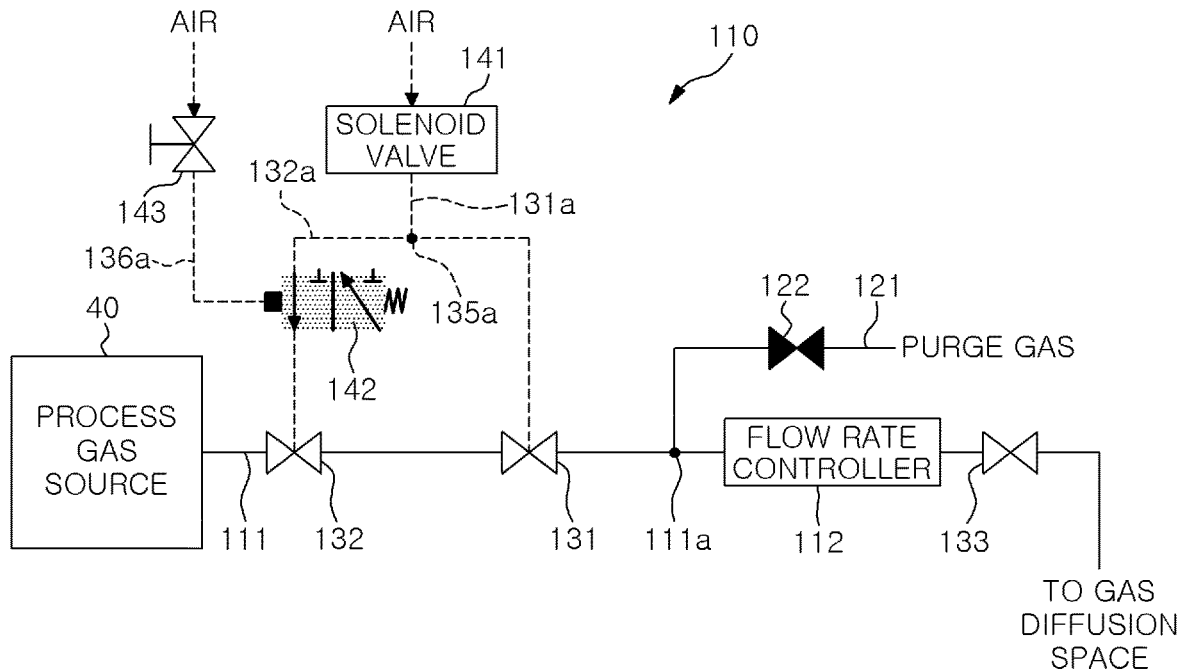
FIG. 2 shows an example of a schematic configuration of a gas supply system according to the embodiment.

Next, a configuration of the gas supply system 110 according to an embodiment will be described. FIG. 2 shows an example of a schematic configuration of the gas supply system according to the embodiment.

The process gas source 40 has a gas source group including a plurality of gas sources used for plasma processing such as plasma etching. The process gas source 40 has a valve, a flow rate controller, or the like (all not shown) provided for each of the gas sources. The process gas source 40 is configured to supply a single processing gas or a processing gas that is a mixture of a plurality of gases depending on plasma processing.

The gas supply system 110 is configured to supply the processing gas supplied from the process gas source 40 to the gas diffusion space 37.

A first gas supply line 111 through which the processing gas to be supplied to the gas diffusion space 37 flows is connected between the process gas source 40 and the substrate processing chamber 12, and the first gas supply line 111 has an intermediate node 111*a*. The process gas source 40 supplies a single processing gas or a processing gas that is a mixture of a plurality of gases to the first gas supply line 111. For example, the processing gas is a CF-based gas, $SiCl_4$, $BCl_4$, $SO_2$, or a mixed gas thereof. The first gas supply line 111 is connected to the gas diffusion space 37.

The first gas supply line 111 is provided with a flow rate controller 112 capable of adjusting the flow rate of the processing gas to be supplied to the gas diffusion space during the supply of the processing gas to the gas diffusion space 37. The processing gas supplied to the first gas supply line 111 reaches the gas diffusion space 37 after the flow rate thereof is adjusted by the flow rate controller 112.

Further, a second gas supply line 121 that is a purge gas supply line is connected upstream of the flow rate controller 112 on the first gas supply line 111 between a purge gas source (not shown) and the intermediate node 111a. The second gas supply line 121 is connected to a purge gas supply source (not shown) and introduces a purge gas supplied from the purge gas supply source into the first gas supply line 111. For example, the second gas supply line 121 introduces an inert gas such as $N_2$ as a purge gas into the first gas supply line 111. By introducing the purge gas into the first gas supply line 111, the processing gas remaining in the first gas supply line 111 and the flow rate controller 112 is purged. The second gas supply line 121 is provided with a valve 122 for switching an opening/closing state of the second gas supply line 121.

The first gas supply line 111 is provided with a first valve 131 that is disposed upstream of the intermediate node 111a to which the second gas supply line 121 is connected. Further, the first gas supply line 111 is provided with a second valve 132 that is disposed upstream of the first valve 131. The first valve 131 and the second valve 132 are air operated valves that are switched from a closed state to an open state by air. Further, a first air supply line 131a is connected between an air source (not shown) and the first valve 131 and has a branch node 135a. A solenoid valve 141 is disposed upstream of the branch node 135a on the first air supply line 131a and is connected to the first valve 131 through the first air supply line 131a. A second air supply line (branch line) 132a that is branched from the branch node 135a of the first air supply line 131a is connected to the second valve 132. The solenoid valve 141 is connected to the air source to supply air to the first valve 131 through the first air supply line 131a and to supply air flowing through the first air supply line 131a to the second valve 132 through the second air supply line 132a.

The second air supply line 132a is provided with a block valve 142 that can be selectively switched between a supply ON state and a supply OFF state. The block valve 142 is an air operated valve. The block valve 142 in the supply ON state allows air flow from the air source through the solenoid valve 141 to the second valve 132 through the second air supply line 132a. On the other hand, the block valve 142 in the supply OFF state blocks the air flow from the solenoid valve 141 to the second valve 132 through the second air supply line 132a. When the block valve 142 is switched to the supply OFF state and the air flow to the second valve 132 is blocked, the second valve 132 is constantly in a closed state. The block valve 142 is connected to a third air supply line 136a and is connected to a manual valve 143 disposed on the third air supply line 136a. The manual valve 143 can be manually opened and closed to allow or block air flow. When the air flow is allowed by opening the manual valve 143, the block valve 142 is switched from the supply OFF state to the supply ON state. Further, when the air flow is stopped by closing the manual valve 143, the block valve 142 is switched from the supply ON state to the supply OFF state. The block valve 142 is basically maintained in the supply ON state, but is switched from the supply ON state to the supply OFF state when the leakage check of the second valve 132 is performed.

Further, the first gas supply line 111 is provided with a valve 133 for switching an opening/closing state of the first gas supply line 111 is disposed downstream of the flow rate controller 112. The valve 133 is always maintained in an open state during the operation of the plasma processing apparatus 10.

In the plasma processing apparatus 10, in the case of switching the gas flowing through the first gas supply line 111 from the processing gas to the purge gas, a first valve 131 disposed upstream of the intermediate node 111a of the second gas supply line 121 on the first gas supply line 111 is switched from an open state to a closed state. At this time, leakage may occur in the first valve 131. When the purge gas begins to be supplied from the second gas supply line 121 to the first gas supply line 111 in a state where the leakage occurs in the first valve 131, the purge gas may pass through the first valve 131 and flow backward to the upstream side of the first gas supply line 111. The backflow of the purge gas to the upstream side of the first gas supply line 111 causes the mixing of the purge gas with the processing gas, which is not preferred.

Therefore, in the plasma processing apparatus 10, the first gas supply line 111 is provided with a second valve 132 disposed upstream of the first valve 131, and both of the first and second valves 131 and 132 are switched from the open state to the closed state at the time of switching the gas flowing through the first gas supply line 111 from the processing gas to the purge gas.

Figure 3:
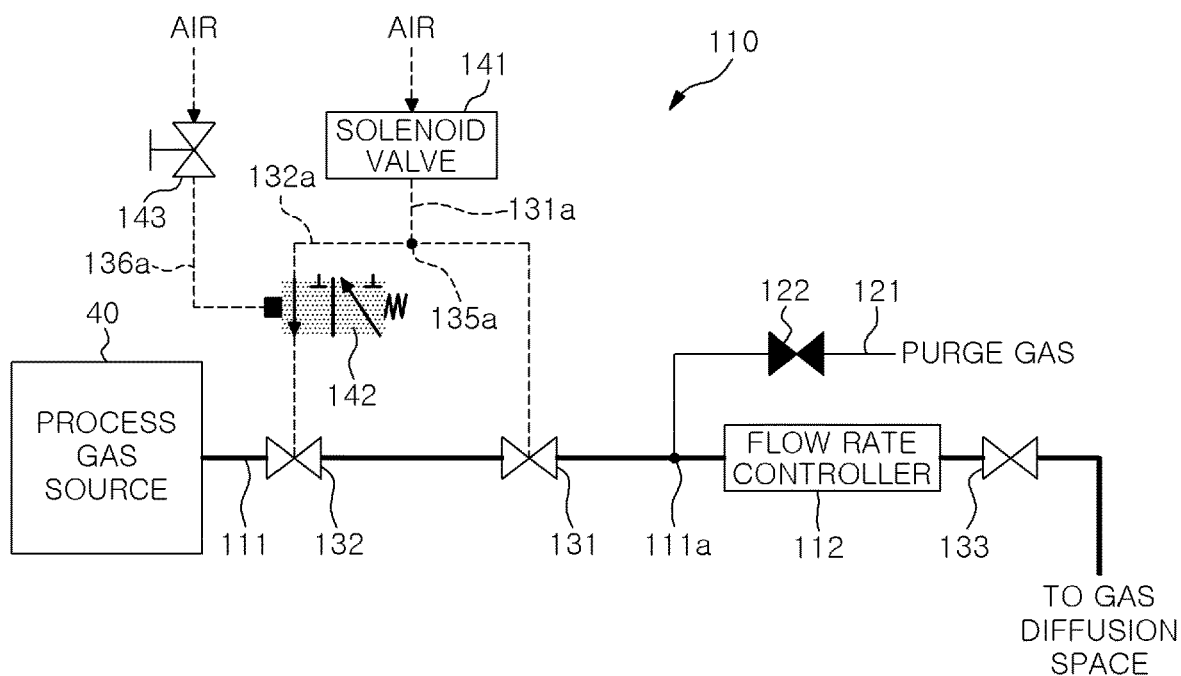
FIGS. 3 and 4 show examples of switching a gas in the embodiment.
Figure 4:
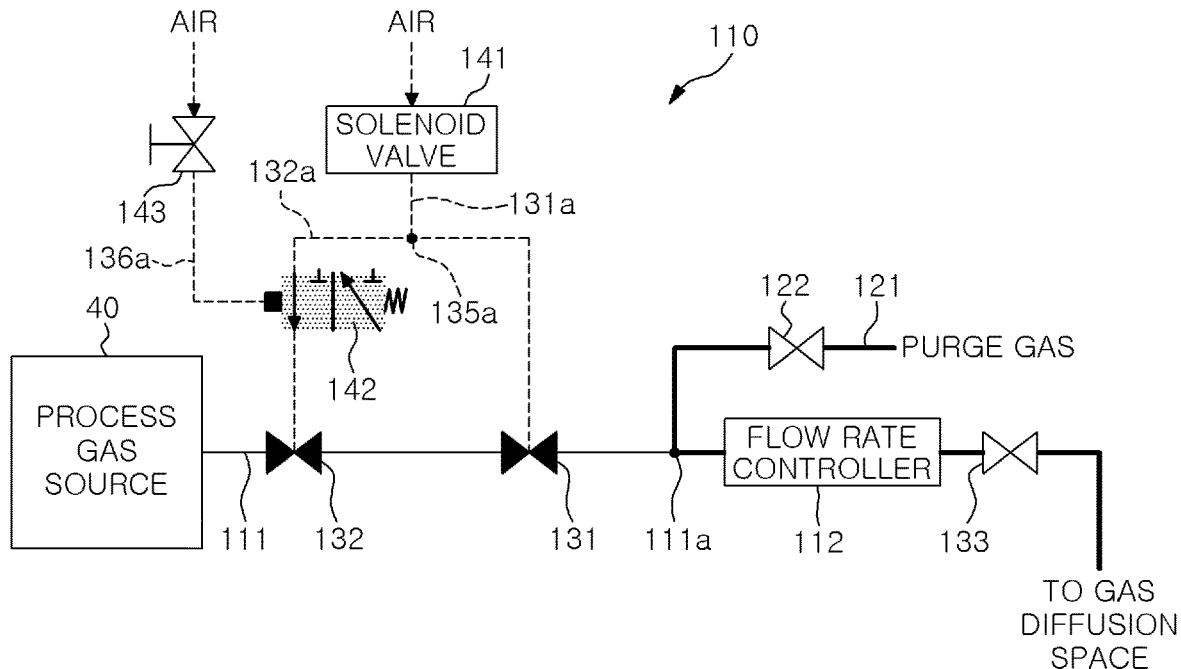

FIGS. 3 and 4 show examples of switching the gas in the embodiment. FIG. 3 shows a case where a processing gas flows through the first gas supply line 111. FIG. 4 shows a case where a purge gas flows through the first gas supply line 111. When the processing gas is supplied from the process gas source 40 to the substrate processing chamber 12 through the first gas supply line 111, the controller 100 controls the first valve 131 and the second valve 132 to open the first and second valves 131 and 132, as shown in FIG. 3 (a first mode). Specifically, the controller 100 controls the first valve 131 and the second valve 132 to open the first and second valves 131 and 132 by opening the solenoid valve 141 to allow air flow therethrough while controlling the valve 122 of the second gas supply line 121 to close the valve 122. Accordingly, the processing gas flowing through the first gas supply line 111 is supplied to the gas diffusion space 37.

In the case of switching the gas flowing through the first gas supply line 111 from the processing gas to the purge gas for supplying the purge gas from the purge gas source to the substrate processing chamber 12, the controller 100 switches the first valve 131 and the second valve 132 from the open state to the closed state, as shown in FIG. 4 (a second mode). Specifically, the controller 100 controls the first valve 131 and the second valve 132 to close the first and second valves 131 and 132 by closing the solenoid valve 141 to stop the air flow therethrough. Then, the controller 100 controls the valve 122 of the second gas supply line 121 to open the valve 122 after the first valve 131 and the second valve 132 are closed. Accordingly, the purge gas is introduced from the second gas supply line 121 to the first gas supply line 111. Here, the controller 100 may control the first valve 131 and the second valve 132 to simultaneously open the first and second valves 131 and 132 when supplying the processing gas through the first gas supply line 111, and simultaneously close the first and second valves 131 and 132 when switching the gas flowing through the first gas supply line 111 from the processing gas to the purge gas.

In the plasma processing apparatus 10, the first valve 131 and the second valve 132 are both switched from the open state to the closed state at the time of switching the gas flowing through the first gas supply line 111 from the processing gas to the purge gas, so that the upstream side of the first gas supply line 111 can be blocked by using a double valve. Accordingly, the backflow of the purge gas to the upstream side of the first gas supply line 111 can be suppressed.

Meanwhile, if leakage occurs in both of the first valve 131 and the second valve 132 at the time of switching the gas flowing through the first gas supply line 111 from the processing gas to the purge gas, backflow of the purge gas to the upstream side of the first gas supply line 111 may occur. Therefore, it is preferable to individually perform leakage check of the first valve 131 and the second valve 132. Hereinafter, the individual leakage checks of the first valve 131 and the second valve 132 will be described.

Figure 5:
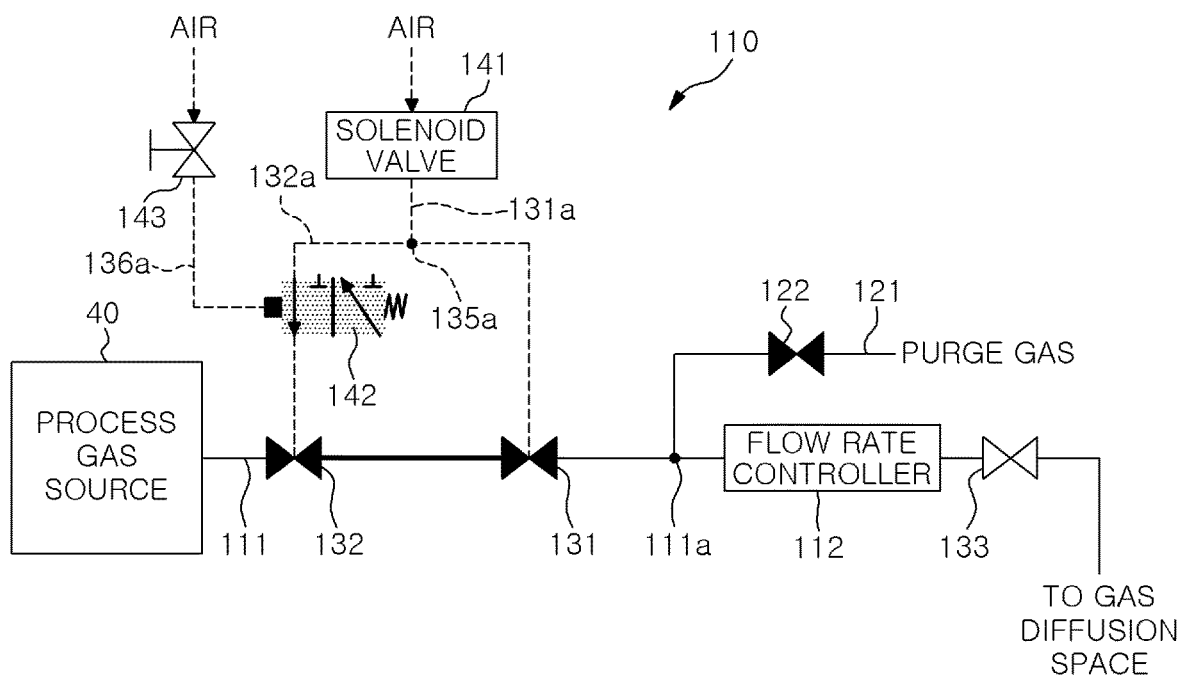
FIGS. 5 and 6 show examples of a leakage check in the embodiment.
Figure 6:
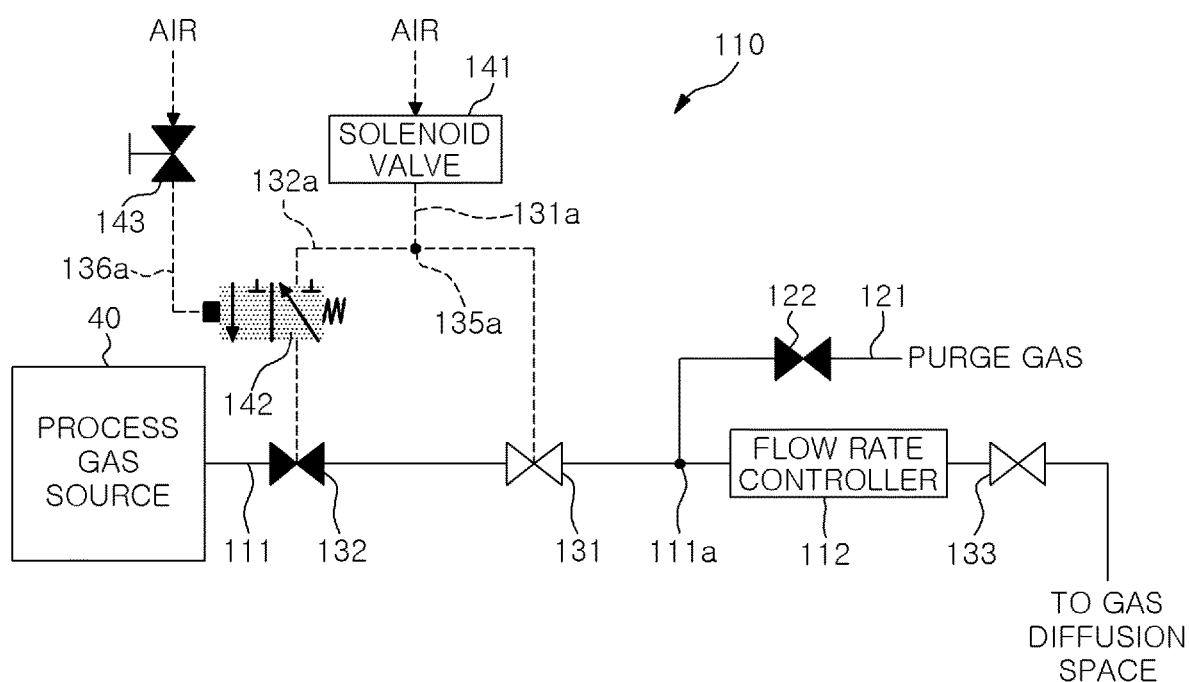

FIGS. 5 and 6 show examples of a leakage check in the embodiment. FIG. 5 shows a case of performing a leakage check of the first valve 131. FIG. 6 shows a case of performing a leakage check of the second valve 132.

In the case of performing the leakage check of the first valve 131, first, the controller 100 controls the first valve 131 and the second valve 132 to open the first and second valves 131 and 132 for a predetermined period of time, and then controls the first valve 131 and the second valve 132 to close the first and second valves 131 and 132 as shown in FIG. 5. Specifically, the controller 100 controls the first valve 131 and the second valve 132 to open the first and second valves 131 and 132 for a predetermined period of time by opening the solenoid valve 141 to allow air flow, and then controls the first valve 131 and the second valve 132 to close the first and second valves 131 and 132 by closing the solenoid valve 141 to stop the air flow therethrough. Accordingly, the processing gas is trapped in the first gas supply line 111 between the first valve 131 and the second valve 132. In a state where the processing gas is trapped between the first valve 131 and the second valve 132, the controller 100 controls the exhaust device 50 to perform vacuum evacuation and performs the leakage check of the first valve 131 based on the pressure in the substrate processing chamber 12 measured by a pressure gauge (not shown).

When the leakage check of the first valve 131 is completed, the block valve 142 is switched from the supply ON state to the supply OFF state as shown in FIG. 6, and the leakage check of the second valve 132 is started. In the case of performing the leakage check of the second valve 132, first, the controller 100 controls the first valve 131 to open the first valve 131 (that is, the first valve 131 is switched from the closed state to the open state). Specifically, the controller 100 controls the first valve 131 to open the first valve 131 by opening the solenoid valve 141 to allow air flow therethrough. Here, since the block valve 142 is switched to the supply OFF state, the air flow from the solenoid valve 141 to the second valve 132 through the second air supply line 132a is blocked. By blocking the air flow to the second valve 132, the second valve 132 is constantly in the closed state, and only the first valve 131 is switched from the closed state to the open state. Therefore, the processing gas trapped in the first gas supply line 111 between the first valve 131 and the second valve 132 is released to the downstream side of the first valve 131. Thereafter, the controller 100 controls the exhaust device 50 to perform vacuum evacuation and performs the leakage check of the second valve 132 based on the pressure in the substrate processing chamber 12 measured by a pressure gauge (not shown).

In the plasma processing apparatus 10 described above, it is possible to switch the opening/closing state of the first valve 131 independently of the second valve 132 by blocking the air flow to the second valve 132 using the block valve 142, and it is also possible to perform the leakage check of the first valve 131 and the second valve 132 individually.

As described above, the gas supply system 110 of the present embodiment includes the first gas supply line 111, the second gas supply line 121, the first valve 131, the second valve 132, and the controller 100. A processing gas used for substrate processing flows through the first gas supply line 111. The second gas supply line 121 is connected to the first gas supply line 111 and introduces the purge gas into the first gas supply line 111. The first valve 131 is disposed upstream of the intermediate node 111a on the first gas supply line 111 and the second gas supply line 121 is connected to the intermediate node 111a. The second valve 132 is disposed upstream of the first valve 131 on the first gas supply line 111. The controller 100 controls the first valve 131 and the second valve 132 to open the first and second valves 131 and 132 in the first mode for supplying the processing gas from the process gas source 40 to the substrate processing chamber 12 through the first gas supply line 111. Further, when the gas flowing through the first gas supply line 111 is switched from the processing gas to the purge gas in the second mode for supplying the purge gas from the purge gas source to the substrate processing chamber 12, the controller 100 controls the first valve 131 and the second valve 132 to close the first and second valves 131 and 132. Accordingly, the gas supply system 110 can suppress the backflow of the purge gas to upstream side of the first gas supply line 111.

In the gas supply system 110, the first valve 131 and the second valve 132 are air operated valves that are switched from the closed state to the open state by supplying air. The gas supply system 110 further includes the solenoid valve 141 for supplying air to the first valve 131 through the first air supply line 131a and supplying the air flowing through the first air supply line 131a to the second valve 132 through the second air supply line 132a branched from the first air supply line 131a. The controller 100 in the gas supply system 110 controls the first valve 131 and the second valve 132 to open the first and second valves 131 and 132 by opening the solenoid valve 141 to allow air flow therethrough in the first mode for supplying the processing gas from the process gas source 40 to the substrate processing chamber 12 through the first gas supply line 111. Further, when the gas flowing through the first gas supply line 111 is switched from the processing gas to the purge gas in the second mode for supplying the purge gas from the purge gas source to the substrate processing chamber 12, the controller 100 controls the first valve 131 and the second valve 132 to close the first and second valves 131 and 132 by closing the solenoid valve 141 to stop the air flow therethrough. Therefore, in the gas supply system 110, the upstream side of the first gas supply line 111 can be blocked by using the double air operated valve. Accordingly, the backflow of the purge gas to the upstream side of the first gas supply line 111 can be suppressed.

The gas supply system 110 further includes the air operated block valve 142 that is disposed on the second air supply line 132a and can be selectively switched between the supply ON state and the supply OFF state. The block valve 142 in the supply ON state allows the air flow from the air source through the solenoid valve 141 to the valve 132 through the second air supply line 132a. The block valve 142 in the supply OFF state blocks the air flow from the solenoid valve 141 to the second valve 132 through the second air supply line 132a. Accordingly, the gas supply system 110 can switch the opening/closing state of the first valve 131 independently of the second valve 132. Further, the gas supply system 110 can perform the leakage check of the first valve 131 and the second valve 132 individually.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. A gas supply system comprising:
a first gas supply line connected between a process gas source and a substrate processing chamber, the first gas supply line having an intermediate node;
a second gas supply line connected between a purge gas source and the intermediate node;
a first valve disposed upstream of the intermediate node on the first gas supply line;
a second valve disposed upstream of the first valve on the first gas supply line;
a first air supply line connected between an air source and the first valve, the first air supply line having a branch node;
a second air supply line connected between the branch node and the second valve;
a solenoid valve disposed upstream of the branch node on the first air supply line; and
a controller to control the first valve and the second valve to open the first and second valves in a first mode for supplying a process gas from the process gas source to the substrate processing chamber, and close the first and second valves in a second mode for supplying a purge gas from the purge gas source to the substrate processing chamber,
wherein the first and second valves are air operated valves, and
the controller is configured to control the solenoid valve to open the solenoid valve in the first mode, and close the solenoid valve in the second mode.

2. The gas supply system of claim 1, wherein the controller is configured to control the first valve and the second valve to simultaneously open the first and second valves in the first mode, and simultaneously close the first and second valves in the second mode.

3. The gas supply system of claim 1, further comprising:
a block valve disposed on the second air supply line, the block valve allowing an air flow from the air source to the second valve to be blocked.

4. The gas supply system of claim 3, wherein the block valve is an air operated valve.

5. The gas supply system of claim 4, further comprising:
a third air supply line connected to the block valve; and
a manual valve disposed on the third air supply line.

6. A substrate processing system, comprising:
a substrate processing chamber having a gas inlet and a gas outlet;
an exhaust device connected to the gas outlet; and
a gas supply system connected to the gas inlet, the gas supply system including:
a first gas supply line connected between a process gas source and the gas inlet, the first gas supply line having an intermediate node;
a second gas supply line connected between a purge gas source and the intermediate node;
a first valve disposed upstream of the intermediate node on the first gas supply line;
a second valve disposed upstream of the first valve on the first gas supply line;
a first air supply line connected between an air source and the first valve, the first air supply line having a branch node;
a second air supply line connected between the branch node and the second valve;
a solenoid valve disposed upstream of the branch node on the first air supply line; and
a controller to control the first valve and the second valve to open the first and second valves in a first mode for supplying a process gas from the process gas source to the substrate processing chamber, and close the first and second valves in a second mode for supplying a purge gas from the purge gas source to the substrate processing chamber,
wherein the first and second valves are air operated valves, and
the controller is configured to control the solenoid valve to open the solenoid valve in the first mode, and close the solenoid valve in the second mode.

* * * * *